(12) United States Patent
Lee

(10) Patent No.: US 7,390,611 B2
(45) Date of Patent: Jun. 24, 2008

(54) PHOTORESIST COATING COMPOSITION AND METHOD FOR FORMING FINE PATTERN USING THE SAME

(75) Inventor: Geun Su Lee, Yongjin-si (KR)

(73) Assignee: Hynix Semiconductor Inc., Icheon-Shi (KR)

( * ) Notice: Subject to any disclaimer, the term of this patent is extended or adjusted under 35 U.S.C. 154(b) by 285 days.

(21) Appl. No.: 11/265,734

(22) Filed: Nov. 2, 2005

(65) Prior Publication Data

US 2006/0263716 A1 Nov. 23, 2006

(30) Foreign Application Priority Data

May 20, 2005 (KR) ...................... 10-2005-0042319

(51) Int. Cl.
  *G03C 1/76* (2006.01)
  *G03C 1/492* (2006.01)
  *G03C 1/494* (2006.01)
  *G03C 5/00* (2006.01)

(52) U.S. Cl. ............... 430/270.1; 430/271.1; 430/273.1; 430/330; 430/311

(58) Field of Classification Search .............. 430/270.1, 430/273.1, 271.1, 330, 311
See application file for complete search history.

(56) References Cited

U.S. PATENT DOCUMENTS

| 4,395,541 | A | * | 7/1983 | Jacquet et al. | ............... 528/367 |
| 6,706,167 | B1 | * | 3/2004 | Pearson et al. | ............... 205/244 |
| 6,916,594 | B2 | | 7/2005 | Bok | |
| 2005/0175926 | A1 | | 8/2005 | Sugeta | |

FOREIGN PATENT DOCUMENTS

KR 1020040060707 A 7/2004

* cited by examiner

*Primary Examiner*—Geraldina Visconti
(74) *Attorney, Agent, or Firm*—Marshall, Gerstein & Borun LLP

(57) ABSTRACT

A photoresist coating composition that includes a compound represented by Formula 1 and an aqueous solvent, and a method for forming a fine pattern by coating the composition on a photoresist pattern to effectively reduce a size of a photoresist contact hole and a space, which can be applied to all of the semiconductor processes.

17 Claims, 7 Drawing Sheets

PHOTORESIST COATING COMPOSITION AND METHOD FOR FORMING FINE PATTERN USING THE SAME

BACKGROUND OF THE DISCLOSURE

1. Field of the Disclosure

The disclosure relates generally to a photoresist coating composition and a method for forming a fine pattern using the same. More specifically, the disclosure relates to a photoresist coating composition comprising a water-soluble polymer and an aqueous solvent, and to a method for forming a fine pattern by reducing the size of the photoresist using the same.

2. Description of Related Technology

As the manufacturing technology of semiconductor devices has developed and the fields of application of memory devices has been extended, the development of lithography processes, (i.e., the development of photoresist materials, new exposure light sources, and light exposer technology) has been accelerated to develop memory devices with improved integration. However, since the resolution obtained by using commonly-used KrF and ArF light exposer is limited within 0.1 μm, it is difficult to form a fine pattern for manufacturing an integrated semiconductor device.

In order to form a conventional fine pattern, resist flow processes (hereinafter, referred to as "RFP"), processes using materials such as RELACS (resist enhancement lithography assisted by chemical shrink), and SAFIER (shrink assist film for enhanced resolution) produced by TOK Company have been introduced.

In the RFP, a photoresist pattern is formed by using an exposure process and a developing process, and then thermal energy is applied at above a glass transition temperature of the photoressist, so that the photoresist may flow thermally. The previously formed pattern has been gradually reduced by the supplied heat energy. As a result, a fine pattern is formed to have a small size required in an integrated process.

Referring to FIG. 1, an exposure process and a developing process are performed on a substrate 1 having an underlying layer 3, thereby obtaining a photoresist pattern 5. Then, thermal energy 7 is applied to the resulting structure at above a glass transition temperature of the photoresist for a predetermined time, which results in an inward thermal flow 9 of the photoresist to reduce the size of a contact hole or pattern.

Even when thermal energy is transmitted uniformly to the whole surface of photoresist in the RFP at a temperature above the glass transition temperature, the amount of photoresist flow is relatively larger in the lower portion than in the upper or middle portions. As a result, an overflowing phenomenon occurs such that the upper portion of the pattern becomes wider than the lower portion.

Since most of the photoresist sensitively reacts with the applied heat, the overflowing phenomenon most frequently occurs when the temperature regulation is mis-operated and the flowing time becomes longer than a predetermined value.

In order to reduce the overflowing phenomenon, temperatures of bake ovens for applying heat have been equalized or the baking time has been precisely regulated. However, although the above baking process is improved, the over flowing phenomenon is not reduced or eliminated.

According to the RELACS process, as shown in FIG. 2, an exposure process and a developing process are performed on a substrate 11 having an underlying layer 13, thereby obtaining a photoresist pattern 15. A RELACS material 17 is coated on the whole surface of photoresist, and then a developing process is performed on the resultant structure, by which a thermal process is performs on the resulting structure. As a result, a cross-linking reaction 19 is formed between the RELACS material 17 and the photoresist pattern 15 to reduce the size of a contact hole or a pattern.

According to the method using the SAFIER material, as shown in FIG. 3, an exposure process and a developing process are performed on a substrate 21 having an underlying layer 23, thereby obtaining a photoresist pattern 25. Then, a SAFIER material 27 is coated on the whole surface of the photoresist, and a thermal process is performed on the resulting structure. As a result, the photoresist material is shrunk 29 to form the photoresist pattern 25-1 reduced a size of a contact hole or a pattern.

Although the processes employing the RELACS material or the SAFIER material can reduce the size of the pattern regardless of a duty ratio, they are more costly and residuals remain in the pattern due to the incomplete removal of the water-soluble polymer, which adversely affects subsequent etching processes. As a result, defects are generated in the final devices, which degrades yield and reliability of the devices.

Moreover, since the above-described methods further include a coating process, a thermal process, a developing process, and a wafer cleaning process of two steps, the procedure is more complicated, and the process cost increases.

SUMMARY OF THE DISCLOSURE

The disclosure provides a method for forming a fine pattern which may overcome the above-described problems without use of expensive materials or a more complicated process.

Disclosed herein is a photoresist coating composition comprising a water-soluble polymer which reacts with a photoresist material to form a coating film on its surface.

Also, disclosed herein is a method for forming a fine pattern using the same.

BRIEF DESCRIPTION OF THE DRAWINGS

For a more complete understanding of the invention, reference should be made to the following detailed description and accompanying drawings.

DETAILED DESCRIPTION

Figure 1:
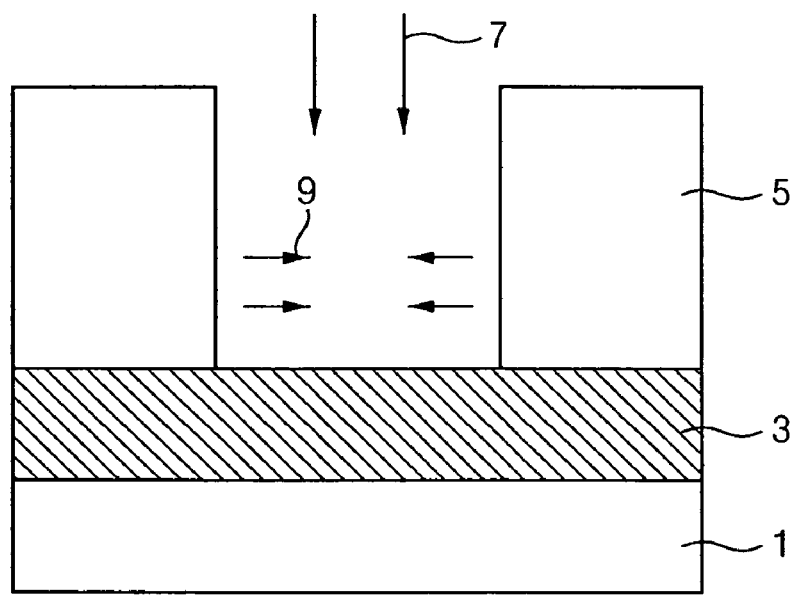
FIG. 1 is a cross-sectional diagram illustrating a method for forming a fine pattern in accordance to a conventional resist flow method.
Figure 1:
Figure 1:
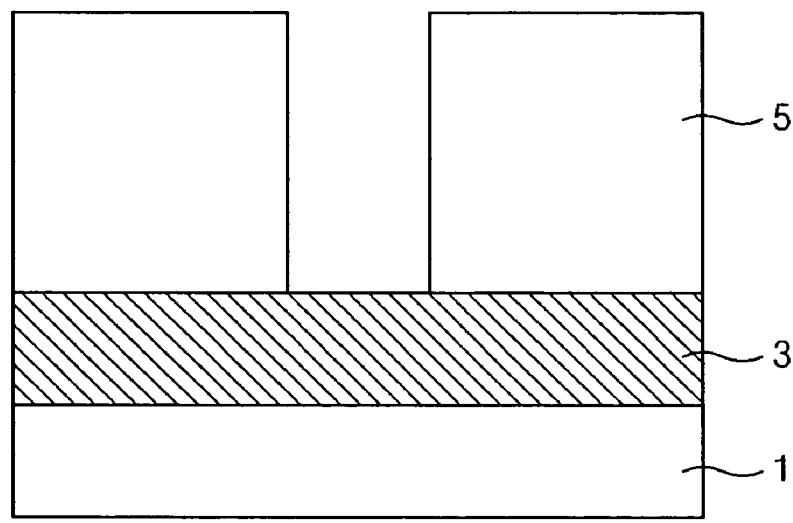
Figure 2:
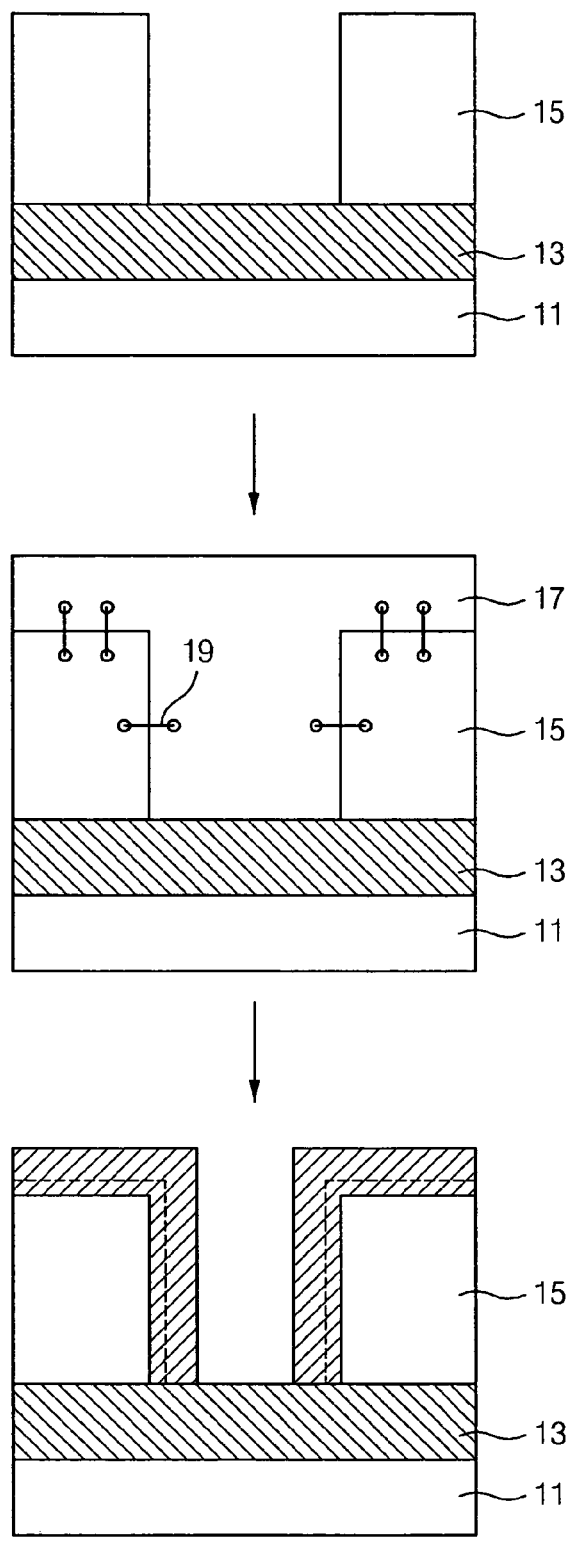
FIG. 2 is a cross-sectional diagram illustrating a method for forming a fine pattern using a conventional RELACS material.
Figure 3:
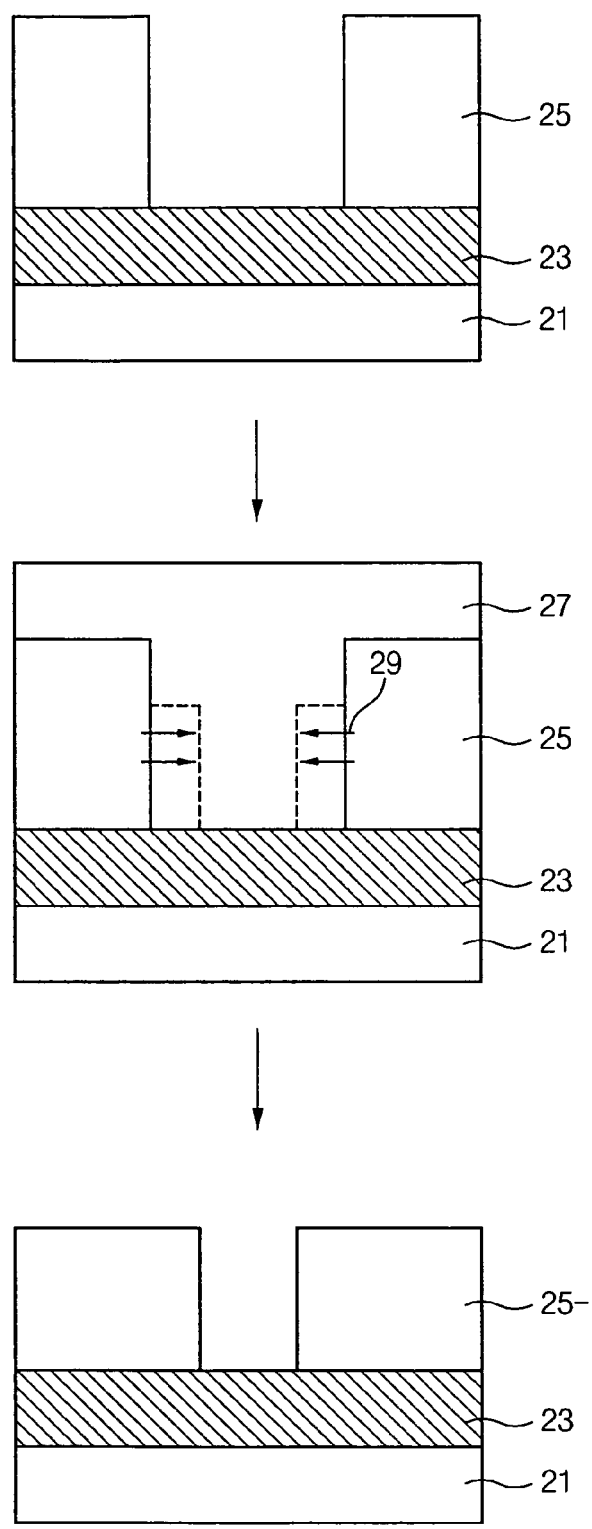
FIG. 3 is a cross-sectional diagram illustrating a method for forming a fine pattern using a conventional SAFIER material.

According to the disclosure, a photoresist coating composition comprises a water-soluble polymer comprising a repeating unit represented by the Formula 1 and an the residual amount of an aqueous solvent:

[Formula 1]

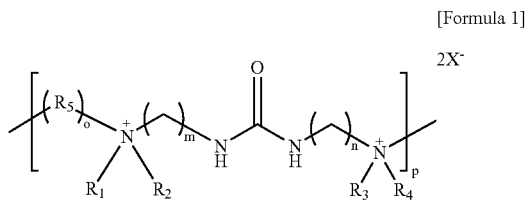

wherein $R_1$, $R_2$, $R_3$ and $R_4$ are individually H or linear or branched $C_1$-$C_{10}$ alkyl;

$R_5$ is linear or branched $C_1$-$C_5$ alkylene including an ether group;

X is a halogen such as F, Cl, Br, or I;

m and n are individually an integer ranging from 1 to 1000;

o is 0 or an integer ranging from 1 to 100; and p is an integer ranging from 1 to 100.

Here, m, n, o and p are not specifically limited to represent the effect of the polymer.

Preferably, the water-soluble polymer of the Formula 1 is poly[bis(2-chloroethyl)ether-alt-1,3-bis[3-(dimethylamino) propyl]urea].

The aqueous solvent is preferably $H_2O$, highly preferably distilled water.

The water-soluble polymer of Formula 1 is present in an amount ranging from 0.1 to 3 parts by weight based on 100 parts by weight of the solvent. A coating film is not formed on the surface of photoresist when the compound of Formula 1 is present in the amount of less than 0.1 parts by weight, and a contact hole is stopped when the compound of Formula 1 is present in the amount of more than 3 parts by weight (based on 100 parts by weight of solvent).

To improve solubility and coating characteristics of the compositing for coating a photoresist pattern, the disclosed composition may further include various additives. The additive is not specifically limited to improve solubility and coating characteristics of the composition. Preferably, the additive is (a) an alcohol compound or (b) a surfactant.

The alcohol compound is preferably selected from the group consisting of $C_1$-$C_{10}$ alkyl alcohols and $C_2$-$C_{10}$ alkoxy alkylalcohols. Preferably, the $C_1$-$C_{10}$ alkyl alcohol is selected from the group consisting of methanol, ethanol, propanol, isopropanol, n-butanol, sec-butanol, t-butanol, 1-pentanol, 2-pentanol, 3-pentanol, 2,2-dimethyl-1-propanol and combination thereof. The $C_2$-$C_{10}$ alkoxy alkylalcohol is preferably selected from the group consisting of 2-methoxyethanol, 2-(2-methoxyethoxy)ethanol, 1-methoxy-2-propanol, 3-methoxy-1,2-propandiol and combinations thereof.

The surfactant is not specifically limited to improve coating characteristics.

Preferably, the additive is present in an amount ranging from 1 to 10 wt %, preferably 1 to 3 parts by weight based on 100 parts by weight of the solvent. When the surfactant is included in the additive, the surfactant is present in an amount ranging from 0.001 to 0.1 parts by weight based on the 100 parts by weight of the solvent.

The effect of the additive is weak when the additive is present in the amount of less than 1 parts by weight and the photoresist material is dissolved in the additive to deform the pattern when the additive is present in the amount of more than 10 parts by weight.

When the disclosed photoresist coating composition is coated on a previously formed photoresist pattern by a spin-coating method, a cross-linkage is formed between with the photoresist material and the disclosed composition for coating to form a uniform coating film on the photoresist pattern, thereby reducing a space of the pattern or the size of a hole effectively.

The disclosed composition has the following characteristics:

(1) no damage an underlying layer pattern formed while coating the disclosed composition;

(2) to have an excellent adhesion property so as to form a thin film on an interface of the photoresist pattern and a lower interface of the exposed photoresist pattern when the disclosed composition is coated;

(3) to have a similar or higher etching resistance than a conventional photoresist material;

(4) not to generate foams on the surface of the photoresist pattern when the disclosed composition is coated; and (5) to form the profile of the photoresist pattern vertically about at 80°~100° after the disclosed composition is coated.

The disclosed composition can be obtained by filtering a mixture solution comprising the aqueous solvent and the compound of the Formula 1 or a solution further comprising an alcohol compound in the mixture solution in a 0.2 μm filter. The disclosed composition can be applied to all processes for forming a photoresist pattern.

In addition, there is provided a method for forming a photoresist pattern.

The method includes the steps of:

(a) forming a photoresist film on an underlying layer of a semiconductor substrate;

(b) exposing the photoresist film to light;

(c) developing the resulting structure to obtain a first photoresist pattern; and (d) coating the disclosed photoresist coating composition on the first photoresist pattern to form a second photoresist pattern, wherein the size of the second photoresist pattern is smaller than that of the first photoresist pattern.

The method may further comprise a soft-baking process before the exposing step (b) or a post-baking process after the exposing step (b).

The disclosed composition photoresist coating composition of step (d) is preferably sprayed to form a coating layer while a wafer bearing the first photoresist pattern is rotated. The aqueous solvent is evaporated and removed and only the water-soluble polymer remains on the photoresist pattern to form a coating layer while the wafer is rotated.

Preferably, the second photoresist pattern formed in the step (d) has a size reduced by about 20~35% compared to that of the first pattern.

Also, there is provided a semiconductor device manufactured by the above-described method using the disclosed composition.

The disclosed method for forming a pattern will be described in detail with reference to the attached drawings.

Figure 4A:
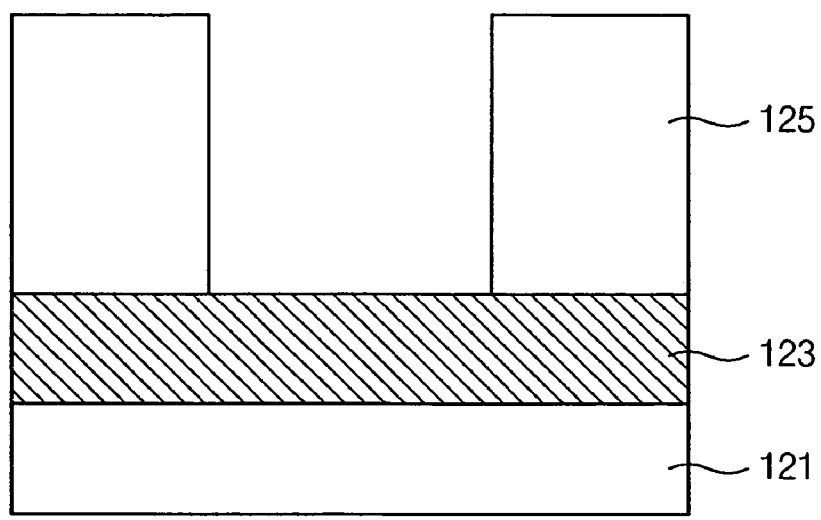
FIGS. 4a and 4b are cross-sectional diagrams illustrating a method for forming a fine pattern using a disclosed composition.

As shown in FIG. 4a, an underlying layer 123 and a photoresist film (not shown) are sequentially formed on a semiconductor substrate 121. Then, an exposure and developing process is performed to form a first photoresist pattern 125.

Here, a soft baking process may be performed before the exposure process, and a post baking process may be performed after the exposure process. Each baking process is preferably performed at a temperature ranging from about 70° C. to about 200° C.

The light is one of KrF (248 nm), ArF (193 nm), VUV (157 nm), EUV (13 nm), E-beam, X-ray or ion-beam, and the exposure process is performed at an exposure energy ranging from about 0.1 mJ/cm$^2$ to about 100 mJ/cm$^2$.

The developing process is performed with an alkali developing solution which is preferably tetramethylammonium hydroxide (TMAH) aqueous solution of about 0.01 wt % to about 5 wt %.

Figure 4B:
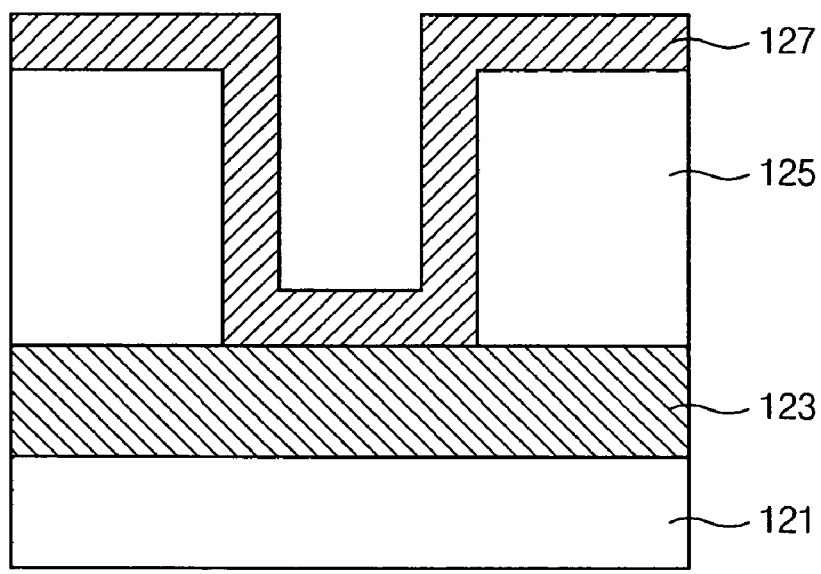

Thereafter, the disclosed composition is coated on the first photoresist pattern 125 of FIG. 4a by a spin-coating method to form a second photoresist pattern formed coating layer 127 as shown in FIG. 4b, thereby reducing a space of the pattern or the size of a contact hole. Preferably, the second photoresist pattern has a size reduced by about 20~35% compared to that of the first pattern.

The disclosed compositions will be described in detail by referring to examples below, which are not intended to limit the present invention.

I. Preparation of a Disclosed Photoresist Coating Composition

EXAMPLE 1

To distilled water (61 g) was added 62 wt % poly[(bis(2-chloroethyl)ether-alt-1,3-bis[3-(dimethylamino)propyl]urea) (1 g) having an average molecular parts by weight of 200,000 (produced by Aldrich Co.). The resulting mixture was stirred at room temperature for one minute, and then filtered with a 0.2 μm filter to obtain a disclosed photoresist coating composition.

EXAMPLE 2

To distilled water (48 g) was added 62 wt % poly[(bis(2-chloroethyl)ether-alt-1,3-bis[3-(dimethylamino)propyl]urea) (1 g) having an average molecular parts by weight of 200,000 (produced by Aldrich Co.) and n-butanol (1 g). The resulting mixture was stirred at room temperature for one minute, and then filtered with a 0.2 μm filter to obtain a disclosed photoresist coating composition.

II. Formation of a Disclosed Fine Pattern

Comparative Example: Process for Forming a General Pattern

Figure 5:
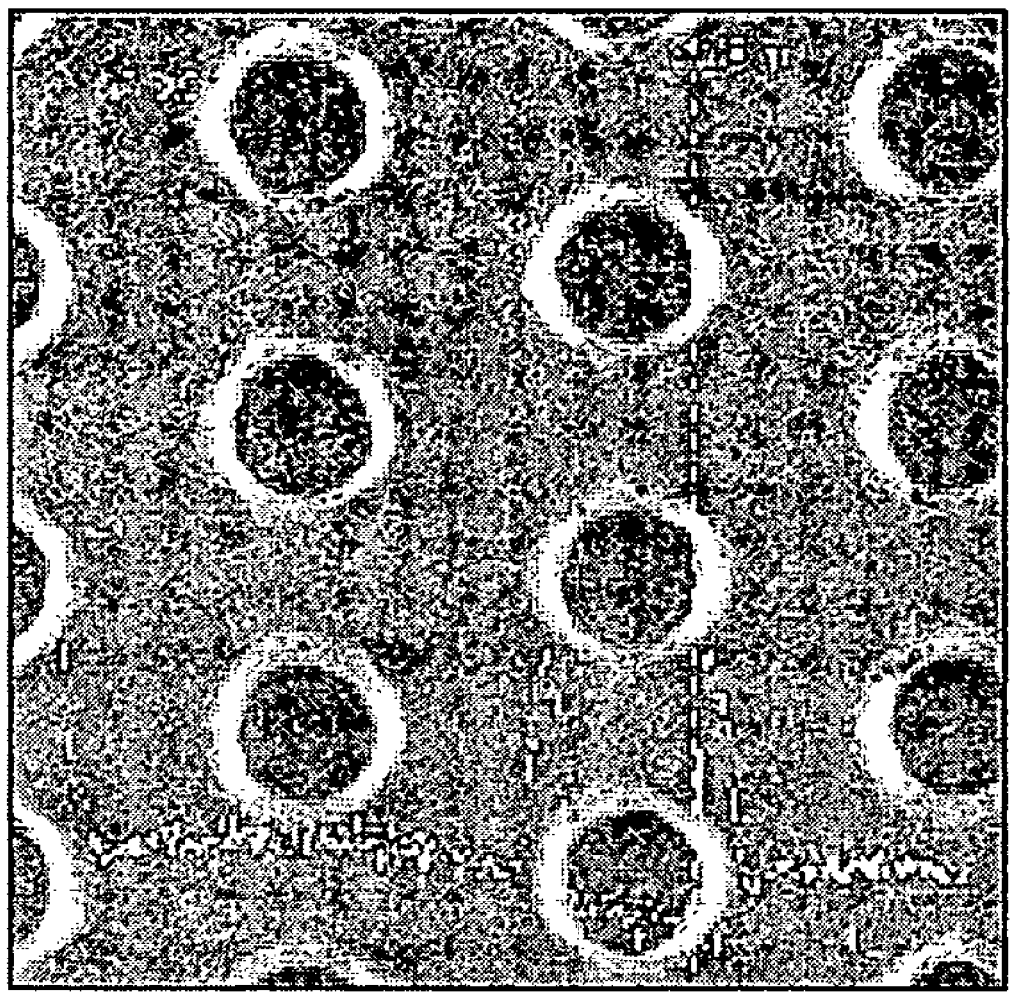
FIG. 5 is a photograph illustrating a photoresist pattern of a Comparative Example.

An underlying layer was formed on a silicon wafer treated with HMDS, and a methacrylate photoresist (TarF-7a-39 produced by TOK Co.) was spin-coated thereon to form a photoresist film at 3,500 Å. Then, the photoresist film was soft-baked at about 130° C. for about 90 seconds. After soft-baking, the photoresist film was exposed to light using an ArF laser exposer, and post-baked at about 130° C. for about 90 seconds. After post-baking, it was developed in 2.38 wt % tetramethylammonium hydroxide (TMAH) aqueous solution for about 30 seconds, to obtain a 110 nm contact hole pattern (see FIG. 5).

EXAMPLE 3

Figure 6:
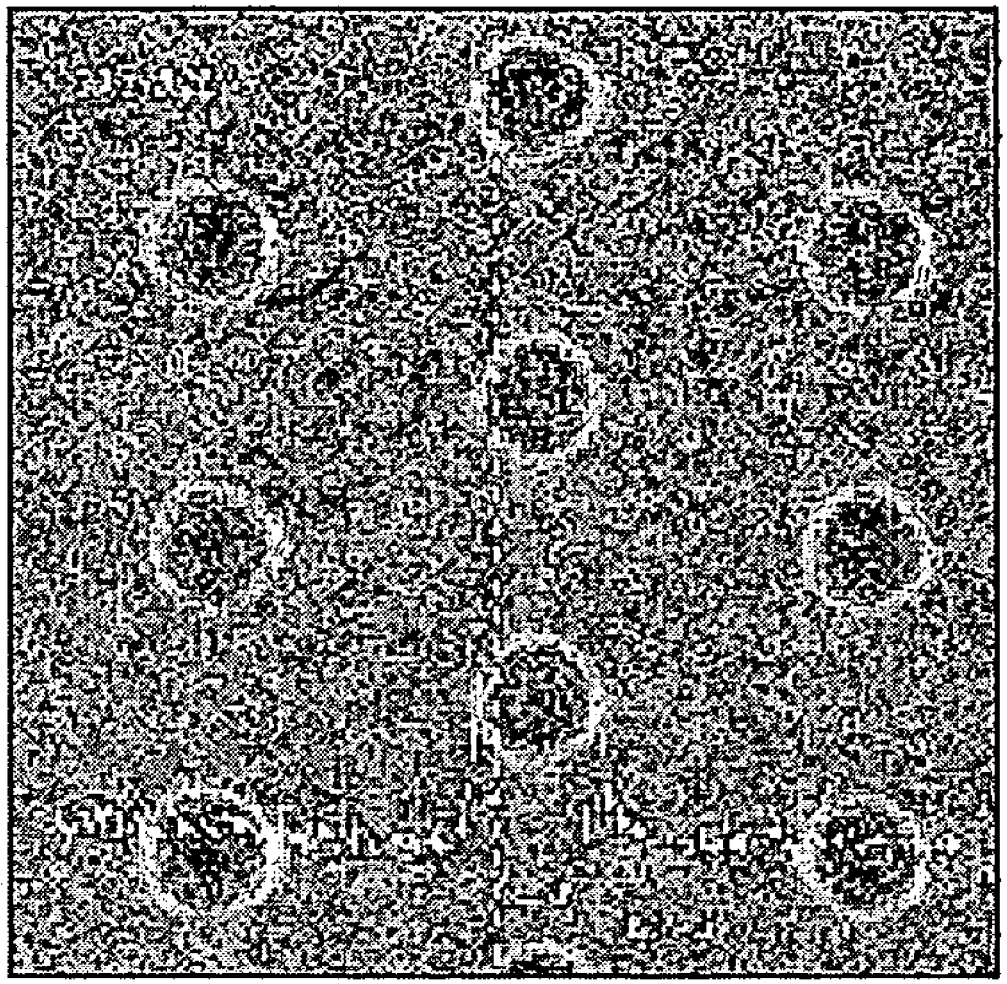
FIG. 6 is a photograph illustrating a photoresist pattern of Example 3.

The composition obtained from Example 1 (10 ml) was spin-coated on the 110 nm contact hole pattern obtained from Comparative Example to obtain a 80 nm contact hole pattern is formed(FIG. 6).

EXAMPLE 4

Figure 7:
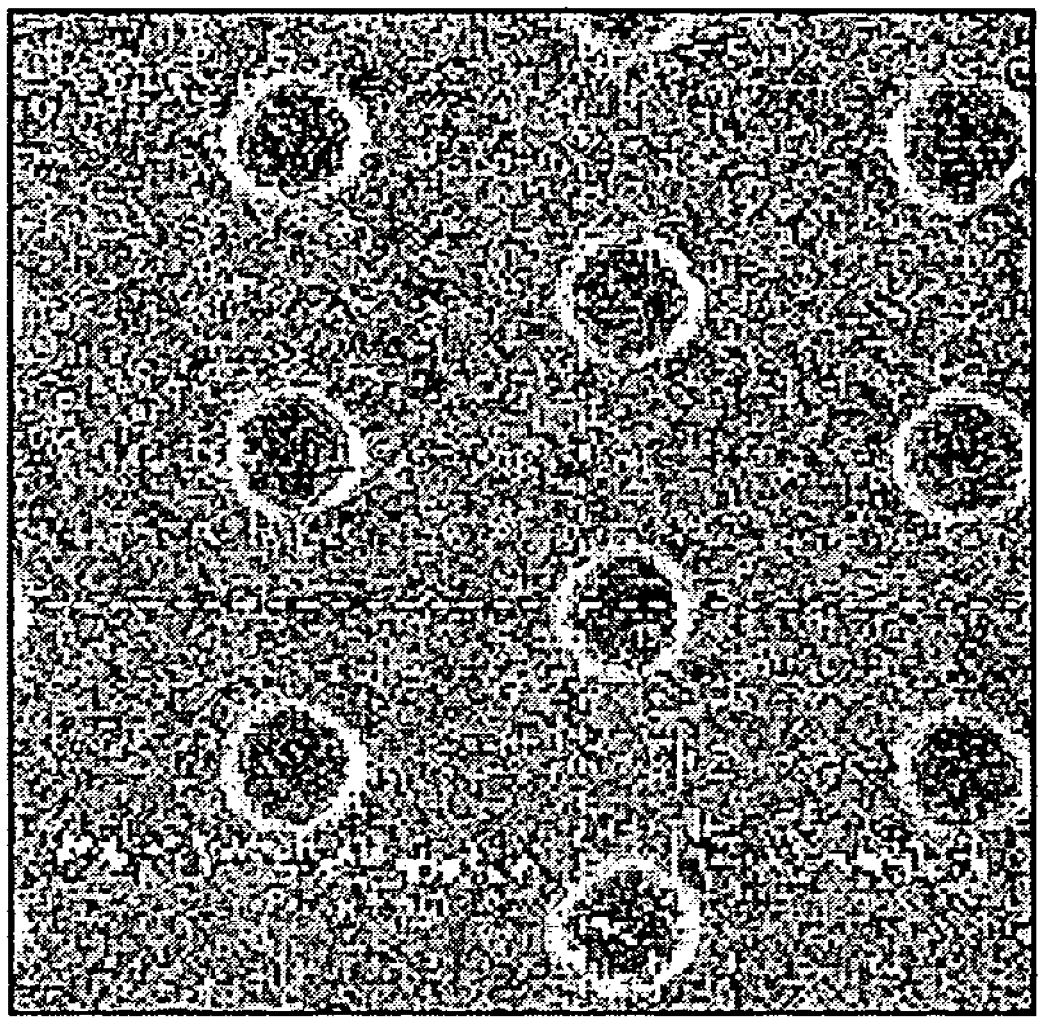
FIG. 7 is a photograph illustrating a photoresist pattern of Example 4.

The composition obtained from Example 2 (10 ml) was spin-coated on the 110 nm contact hole pattern obtained from Comparative Example to obtain a 80 nm contact hole pattern (FIG. 7).

As described above, after photoresist pattern is formed, the disclosed composition for coating a photoresist film is coated thereon to reduce a size of a hole or a space of the photoresist pattern effectively. As a result, the disclosed composition and the disclosed method can be usefully applied to all semiconductor processes for forming a fine pattern.

What is claimed is:

1. A photoresist coating composition comprising a water-soluble polymer having a repeating unit represented by the Formula 1, an aqueous solvent, and an additive selected from the group consisting of an alcohol compound and a surfactant:

[Formula 1]

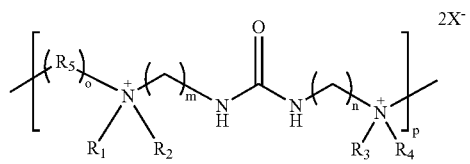

wherein $R_1$, $R_2$, $R_3$ and $R_4$ are individually H or linear or branched $C_1$-$C_{10}$ alkyl;

$R_5$ is linear or branched $C_1$-$C_5$ alkylene including an ether group;

X is a halogen;

m and n are individually an integer ranging from 1 to 1000;

o is 0 or an integer ranging from 1 to 100; and p is an integer ranging from 1 to 100.

2. The composition according to claim 1, wherein the water-soluble polymer of Formula 1 is poly[bis(2-chloroethyl)ether-alt-1,3-bis[3-(dimethylamino)propyl]urea].

3. The composition according to claim 1, wherein the aqueous solvent is $H_2O$.

4. The composition according to claim 1, wherein the water-soluble polymer of the Formula 1 is present in an amount ranging from 0.1 to 3 parts by weight based on 100 parts by weight of the aqueous solvent.

5. The composition according to claim 1, wherein the additive comprises an alcohol compound selected from the group consisting of $C_1$-$C_{10}$ alkyl alcohols and $C_2$-$C_{10}$ alkoxy alkylalcohols.

6. The composition according to claim 5, wherein the additive is a $C_1$-$C_{10}$ alkyl alcohol selected from the group consisting of methanol, ethanol, propanol, isopropanol, n-butanol, sec-butanol, t-butanol, 1-pentanol, 2-pentanol, 3-pentanol, 2,2-dimethyl-1-propanol, and combinations thereof.

7. The composition according to claim 5, wherein the additive is a $C_2$-$C_{10}$ alkoxy alkylalcohol selected from the group consisting of 2-methoxyethanol, 2-(2-methoxyethoxy)ethanol, 1-methoxy-2-propanol, 3-methoxy-1,2-propandiol, and combinations thereof.

8. The composition according to claim 1, wherein the additive is present in an amount ranging from 0.1 to 10 parts by weight based on 100 parts by weight of the aqueous solvent.

9. The composition according to claim 8, wherein the additive is present in an amount ranging from 1 to 3 parts by weight based on 100 parts by weight of the aqueous solvent.

10. The composition according to claim 1, wherein the additive comprises a surfactant in an amount ranging from 0.001 to 0.1 parts by weight based on 100 parts by weight of the aqueous solvent.

11. A method for forming a photoresist pattern, comprising:

(a) forming a photoresist film on an underlying layer of a semiconductor substrate;

(b) exposing the photoresist film to light;
(c) developing the resulting structure of step (b) to obtain a first photoresist pattern; and
(d) coating the a photoresist coating composition on the first photoresist pattern to form a second photoresist pattern, the photoresist coating composition comprising a water-soluble polymer having a repeating unit represented by the Formula 1 and an agueous solvent, wherein the size of the second photoresist pattern is smaller than that of the first photoresist pattern;

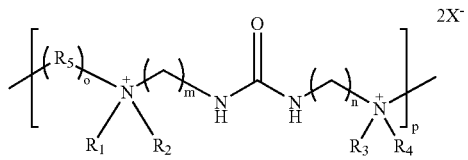

[Formula 1]

wherein $R_1$, $R_2$, $R_3$ and $R_4$ are individually H or linear or branched $C_1$-$C_{10}$ alkyl;
$R_5$ is linear or branched $C_1$-$C_5$ alkylene including an ether group;
X is a halogen;
m and n are individually an integer ranging from 1 to 1000;
o is 0 or an integer ranging from 1 to 100; and
p is an integer ranging from 1 to 100.

12. The method according to claim 11, wherein the exposure light of the step (b) is selected from the group consisting of KrF (248 nm), ArF (193 nm), VUV (157 nm), EUV (13 nm), E-beam, X-ray, and ion beam.

13. The method according to claim 11, further comprising the step of baking the photoresist film before the exposing step (b).

14. The method according to claim 11, further comprising the step of baking the photoresist film after the exposing step (b).

15. The method according to claim 11, comprising forming the second photoresist pattern of step (d) by spraying the photoresist coating composition of claim 1 while rotating a wafer is bearing the first photoresist pattern.

16. The method according to claim 11, wherein the size of the second photoresist pattern formed in step (d) is 20% to 35% smaller than that of the first photoresist pattern.

17. A semiconductor device comprising a photoresist pattern provided by the method of claim 11.

* * * * *